United States Patent
Zhao et al.

(10) Patent No.: US 7,720,601 B2
(45) Date of Patent: *May 18, 2010

(54) METHOD AND APPARATUS FOR COMPRESSING GPS SATELLITE BROADCAST MESSAGE INFORMATION

(75) Inventors: Yilin Zhao, Northbrook, IL (US); Thomas M. King, Tempe, AZ (US); George J. Geier, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 1783 days.

This patent is subject to a terminal disclaimer.

(21) Appl. No.: 10/212,617

(22) Filed: Aug. 5, 2002

(65) Prior Publication Data

US 2003/0011513 A1 Jan. 16, 2003

Related U.S. Application Data

(63) Continuation of application No. 09/504,152, filed on Feb. 15, 2002, now Pat. No. 6,429,811.

(51) Int. Cl.
*G01C 21/00* (2006.01)
*H01S 1/00* (2006.01)
(52) U.S. Cl. .................................. 701/213; 342/357.09
(58) Field of Classification Search ......... 701/213–215; 342/357.06, 357.1, 357.09
See application file for complete search history.

(56) References Cited

U.S. PATENT DOCUMENTS 4,086,525 A 4/1978 Ibsen et al.

(Continued)

FOREIGN PATENT DOCUMENTS

EP 0 439 319 B1 6/1994

(Continued)

OTHER PUBLICATIONS

ION GOS-90, ION Satellite Division 3rd International Technical Meeting, Sep. 17-21, 1990 pp. 1-13.

(Continued)

*Primary Examiner*—Yonel Beaulieu
(74) *Attorney, Agent, or Firm*—Roland K. Bowler, II

(57) ABSTRACT

An assisted global positioning satellite (Assisted GPS) system has a GPS reference network node (260) that collects GPS satellite broadcast messages and prepares separate GPS assistance messages to be modulated by a base transceiver station (BTS) (202) on a cellular carrier signal (201) and sent to single or multiple handset (204). In a first preferred embodiment, instead of the handset (204) receiving standard ephemeris and clock correction data elements in a GPS assistance message, a compressed GPS assistance message containing XYZ information contains a GPS satellite's coordinate position modified according to the satellite clock correction. In a second preferred embodiment, there is a first type of compressed GPS assistance message containing subframe 1, 2, 3 data of a GPS satellite broadcast message and a second type of compressed GPS assistance message containing subframe 4, 5 data of a GPS satellite broadcast message. The compressed GPS assistance messages according to the second preferred embodiment lack redundant or predictable information in order to reduce the size of the compressed GPS assistance message. The first type can be updated at a different rate than the second type in order to reduce the traffic and yet keep the handset (204) up to date.

6 Claims, 6 Drawing Sheets

U.S. PATENT DOCUMENTS

| | | |
|---|---|---|
| 4,445,118 A | 4/1984 | Taylor et al. |
| 5,155,428 A | 10/1992 | Kang |
| 5,293,379 A | 3/1994 | Carr |
| 5,365,450 A | 11/1994 | Schuchman et al. |
| 5,424,721 A | 6/1995 | Asai |
| 5,523,763 A | 6/1996 | Loomis |
| 5,781,156 A | 7/1998 | Krasner |
| 5,874,914 A | 2/1999 | Krasner |
| 5,945,944 A | 8/1999 | Krasner |
| 6,032,197 A | 2/2000 | Birdwell et al. |
| 6,043,777 A | 3/2000 | Bergman et al. |
| 6,044,105 A | 3/2000 | Gronemeyer |
| 6,058,338 A | 5/2000 | Agashe et al. |
| 6,058,874 A | 5/2000 | Glenning et al. |
| 6,064,336 A | 5/2000 | Krasner |
| 6,067,045 A | 5/2000 | Castelloe et al. |
| 6,081,229 A | 6/2000 | Soliman et al. |
| 6,084,544 A | 7/2000 | Camp, Jr. |
| 6,088,348 A | 7/2000 | Bell, III et al. |
| 6,107,960 A | 8/2000 | Krasner |
| 6,111,540 A | 8/2000 | Krasner |
| 6,133,871 A | 10/2000 | Krasner |
| 6,133,874 A | 10/2000 | Krasner |
| 6,134,483 A | 10/2000 | Vayanos et al. |
| 6,266,533 B1 | 7/2001 | Zadeh et al. |
| 6,429,811 B1 * | 8/2002 | Zhao et al. ............ 342/357.09 |

FOREIGN PATENT DOCUMENTS

| | | |
|---|---|---|
| EP | 0 240 883 A2 | 3/1997 |
| GB | 2358977 | 8/2001 |
| JP | 7-131402 | 5/1995 |
| WO | WO 00/10028 | 2/2000 |
| WO | WO 01/11382 | 2/2000 |
| WO | WO 00/14560 | 3/2000 |
| WO | WO 00/14562 | 3/2000 |
| WO | WO 00/14563 | 3/2000 |
| WO | WO 00/14570 | 3/2000 |
| WO | WO 00/14571 | 3/2000 |

OTHER PUBLICATIONS

German Patent Office Action Nov. 10, 2000, 196 21 439.4.

* cited by examiner

— PRIOR ART —

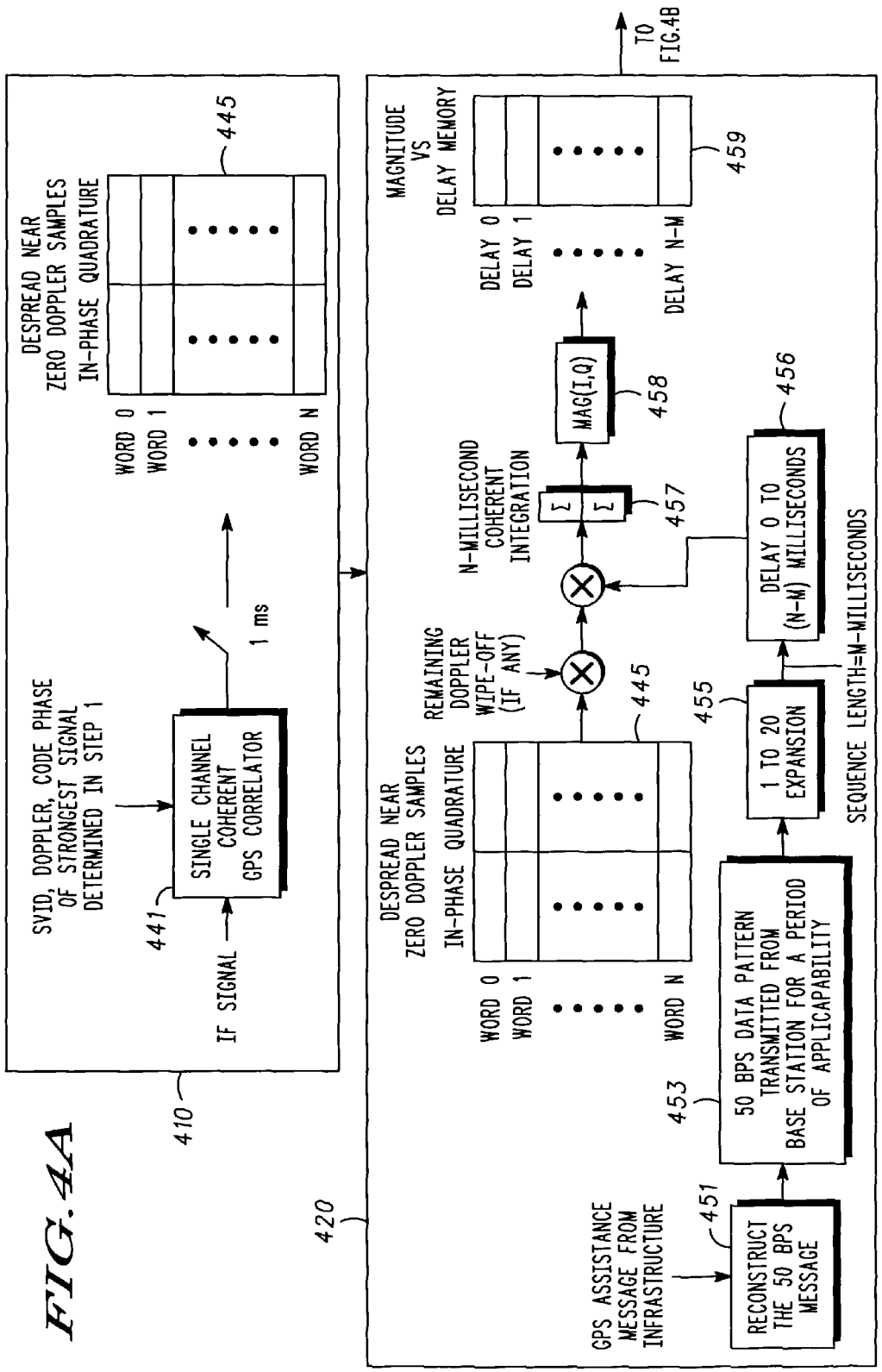

METHOD AND APPARATUS FOR COMPRESSING GPS SATELLITE BROADCAST MESSAGE INFORMATION

CROSS REFERENCE TO RELATED APPLICATIONS

The present application is a continuation of U.S. application Ser. No. 09/504,152 filed on 15 Feb. 2002, now U.S. Pat. No. 6,429,811 issued on 6 Aug. 2002, also entitled "Method and Apparatus for Compressing GPS Satellite Broadcast Message Information", assigned commonly with the present application, the contents of which are incorporated herein by reference, and from which priority under 35 USC 120 is claimed.

FIELD OF THE INVENTION

The present invention relates generally to location services in radio communication systems. More particularly, the present invention relates to a method and apparatus for assisting a mobile handset in determining its location using assisted global positioning system (Assisted GPS) location determination capabilities in a radio communication system.

BACKGROUND OF THE INVENTION

A GPS receiver determines its position on Earth by using the GPS constellation of twenty-four satellites orbiting twice a day at an altitude of approximately 20,183.61 kilometers above Earth's surface. These satellites provide navigation references to allow triangulation with three to four satellites acting as precise reference points to determine position (latitude, longitude, altitude, and in some applications velocity) at the GPS receiver. The GPS satellites are provided in six orbital planes, at 55 degree inclination. Each orbital plane contains four satellites. The GPS constellation should provide a GPS receiver with four to twelve satellites being visible from any point on Earth having a clear view of the sky.

Traditionally, GPS satellites transmit ephemeris and clock correction parameters directly to GPS receivers. The ephemeris and clock correction data gives a GPS receiver all the information it needs to compute the satellite position as a function of time, and to compute the satellite clock error parameter, also as a function of time. A GPS satellite transmits the data in a broadcast mode from the satellite to the ground at a slow 50 bit per second (BPS) rate. It takes between eighteen and thirty seconds for a single GPS satellite broadcast message to be transmitted one time, depending on when the GPS receiver synchronizes with the transmitted broadcast message. The specification for the over-the-air protocol for the satellite-to-ground message is published in ICD-GPS-200 Specification, published by Rockwell Corporation.

FIG. 1 details a prior art GPS satellite broadcast message 100. Each message 100 has five subframes, subframe 1 111, subframe 2 112, subframe 3 113, subframe 4 114, and subframe 5 115. Each subframe 111, 112, 113, 114, 115 has ten words 120, 121, 122, 123, 124, 125, 126, 127, 128, 129 of thirty bits each. Each thirty-bit word has twenty-four information bits and six bits of parity. For the first word in each subframe, the telemetry (TLM) word 120, there is a fixed eight-bit preamble 131, a sixteen-bit data section 132, and the six-bit parity 133. For the second word in each subframe, a hand-over word (HOW) 121, there a seventeen-bit time of week (TOW) parameter 141, a seven-bit data section 142 containing a three-bit subframe identification, and the six-bit parity 143. Because GPS satellite data messages are transmitted at 50 BPS, it takes precisely six seconds to transmit each 300-bit subframe 111, 112, 113, 114, 115 and thirty seconds to transmit the entire 1500-bit message 100. Refer to ICD-GPS-200 Specification for complete details on the GPS satellite broadcast message content and format.

The message transmission is precisely synchronized with GPS time, and the message 100 is such that each bit of the 50 BPS sequence is precisely known in GPS time coordinates. Each bit represents 0.02 seconds additionally-elapsed time since midnight of the previous Saturday in Greenwich, England. The GPS system keeps track of this elapsed time by the TOW parameter 141. The GPS clock starts at midnight Saturday in Greenwich, England and counts seconds until the next Saturday at midnight. There are 604,800 seconds contained in one GPS week, then the clock is reset to begin the next week. A GPS Week counter is then used to keep track of time outside of one week. Within one data bit, time is known to within 0.001 seconds, because each data bit of the 50 BPS message is also coherent and synchronized with the 1023-bit spread spectrum spreading code. It takes precisely twenty repeats of the signal spreading code to create one data bit. Thus, time is known to under 20 millisecond accuracy by a GPS receiver counting the integer number of pseudo random noise (PRN) code repeats.

Finally, time is known to one millisecond accuracy by a GPS receiver measuring the fraction of one PN code repeat interval (also known as the code phase at the measurement time). Consequently, the 50 BPS message and underlying PN spreading code is used by every GPS receiver built today to obtain a measure of the time as transmitted from the GPS satellite, effectively translating the precise clock in the satellite to the ground-based GPS receiver by adding the propagation delay from the satellite to the receiver to the time indicated by the 50 BPS message.

In any implementation in which a GPS receiver (or sensor) in embedded into a cellular phone for location purposes, the slow 50 BPS data rate is a problem because it slows the availability of position coordinates and thus slows down a response to the location determination request. In addition, the data transmitted at 50 BPS can become difficult to demodulate in weak signal conditions such as in a building or under heavy foliage. To combat this problem, the idea of Assisted GPS was created.

In Assisted GPS, communications network infrastructure is used to assist the mobile GPS receiver, which can be implemented as a standalone device or integrated with a radiotelephone handset. Assisted GPS establishes a GPS reference network (or a wide-area DGPS network, explained in further detail below) whose reference GPS receivers have clear views of the sky and can operate continuously to monitor the real-time GPS constellation status. The GPS reference network thus provides precise data for each GPS satellite at a particular epoch time. This GPS reference network is also connected with the cellular infrastructure.

At least three modes of Assisted GPS operation can be supported: "MS-assisted," "MS-based," and "autonomous." For MS-assisted GPS, the mobile station (MS) GPS receiver position is calculated at the network. Typically, the mobile station receives assistance data, such as GPS time, Doppler, and code phase search window, and transmits pseudo range data back to the network. For MS-based GPS, the mobile station GPS receiver's position is calculated at the handset. Typically, the mobile station receives assistance data, such as GPS time, ephemeris, and clock correction, and transmits the calculated position back to the network if required. For autonomous GPS, the mobile station GPS receiver's position is calculated at the handset with very limited assistance from the network (or no assistance at all). Autonomous GPS can be loosely characterized as MS-based, although typically for autonomous GPS, the mobile GPS receiver's position is determined independently without network assistance.

For any GPS application, position errors are contributed by the satellite clock, satellite orbit, ephemeris prediction, ionospheric delay, tropospheric delay, and selective availability (SA), which is an accuracy degradation scheme designed to reduce the position accuracy available to civilian users. To reduce these errors, range and range-rate corrections can be applied to the raw pseudo range measurements in order to create a position solution that is accurate to a few meters in open environments. One such correction technique is differential GPS (DGPS), which uses a reference GPS receiver at a surveyed position to send correcting information to a mobile station GPS receiver over a communication link. For MS-assisted GPS, corrections can be applied directly at the network or a server to the pseudo ranges and pseudo range-rates received from the mobile GPS receiver. For MS-based GPS, corrections must be transmitted to the mobile GPS receiver either via "point-to-point" or "broadcast" ("point-to-multipoint") transmissions. Note that Assisted GPS may operate with or without differential GPS corrections; the corrections are generally required, however, for those location applications with the most demanding accuracy requirements.

The determination of accurate GPS time in an Assisted GPS receiver is important for location determination, because GPS satellite positioning is based on a time of arrival (TOA) principle. The TOA principle pinpoints a GPS receiver's location with time-stamped range information, and thus the accuracy of the GPS time in the GPS receiver affects the integrity of the location calculated from the GPS signals.

The three main types of information transmitted include the satellite transmission of its own position, the satellite time, and a PRN code which is used by the GPS GPS receiver to calculate its range from the satellite. The satellite position and time is derived from precise ground-based tracking equipment and atomic clocks accurate to one second in 300,000 years. The internal stream of PRN code (which appears as a very long sequence of random bits) generated in the GPS receiver can be compared to the received bits of PRN code from the satellite; aligning the two data streams to obtain a time shift or displacement represents the precise travel time from the satellite to the GPS receiver.

At the GPS signal-receiving end, the four main conventional GPS receiver functions are:

1) Measuring distance from the satellites to the receiver by determining the pseudo ranges (code phases);

2) Extracting the time of arrival of the signal from the contents of the satellite transmitted message;

3) Computing the position of the satellites by evaluating the ephemeris data at the indicated time of arrival; and 4) Calculating the position of the receiving antenna and the clock bias of the receiver by using the above data items.

The process of searching for and acquiring GPS signals, decoding satellite positioning data (and other data) for several satellites, and computing the accurate time of day for the location of the GPS receiver from such data is computationally extensive and time consuming.

What is needed is a method of transmitting the data from the raw 1500-bit long pattern for all the subframes of a GPS satellite broadcast message in an efficient manner so that a GPS receiver can utilize the contents of the entire 1500-bit message without having to actually receive all the bits. This accomplishes both goals of delivering the satellite orbit parameters and providing the GPS receiver with a method of time synchronization. It would be further desirable to provide a method and apparatus that provides as minimal degradation as possible in the performance of Assisted GPS systems.

BRIEF DESCRIPTION OF THE DRAWINGS

FIG. 4A and FIG. 4B show the process of time determining using decompressed information from a GPS assistance message in accordance with the preferred embodiments.

DETAILED DESCRIPTION OF THE PREFERRED EMBODIMENT

With the desire to provide location determination services in mobile cellular and PCS telephone networks, positioning systems that take advantage of the global positioning system (GPS) may facilitate the measuring of handset location using time-related satellite data messages. Accordingly, there is disclosed a method and apparatus for providing GPS satellite broadcast message information to a GPS receiver and providing accurate time to the GPS receiver in an Assisted GPS radio communication system. Although the embodiments discussed herein refers to the use of the GPS satellites, other satellite systems may be employed. In addition, although a GSM cellular network is used as an example to describe the embodiments, other wireless communication systems can alternately be employed.

An Assisted GPS system has a GPS reference network node that collects GPS satellite broadcast messages and prepares separate GPS assistance messages to be modulated by a base transceiver station (BTS) on a cellular carrier signal and sent to single or multiple handset. In a first preferred embodiment, instead of the handset receiving standard ephemeris and clock correction data elements in a GPS assistance message, a compressed GPS assistance message containing XYZ information contains a GPS satellite's coordinate position modified according to the satellite clock correction. In a second preferred embodiment, there is a first type of compressed GPS assistance message containing subframe 1, 2, 3 data of a GPS satellite broadcast message and a second type of compressed GPS assistance message containing subframe 4, 5 data of a GPS satellite broadcast message. The compressed GPS assistance messages according to the second preferred embodiment lack redundant or predictable information in order to reduce the size of the compressed GPS assistance message. The first type can be updated at a different rate than the second type in order to reduce the traffic and yet keep the handset up to date.

Figure 2:
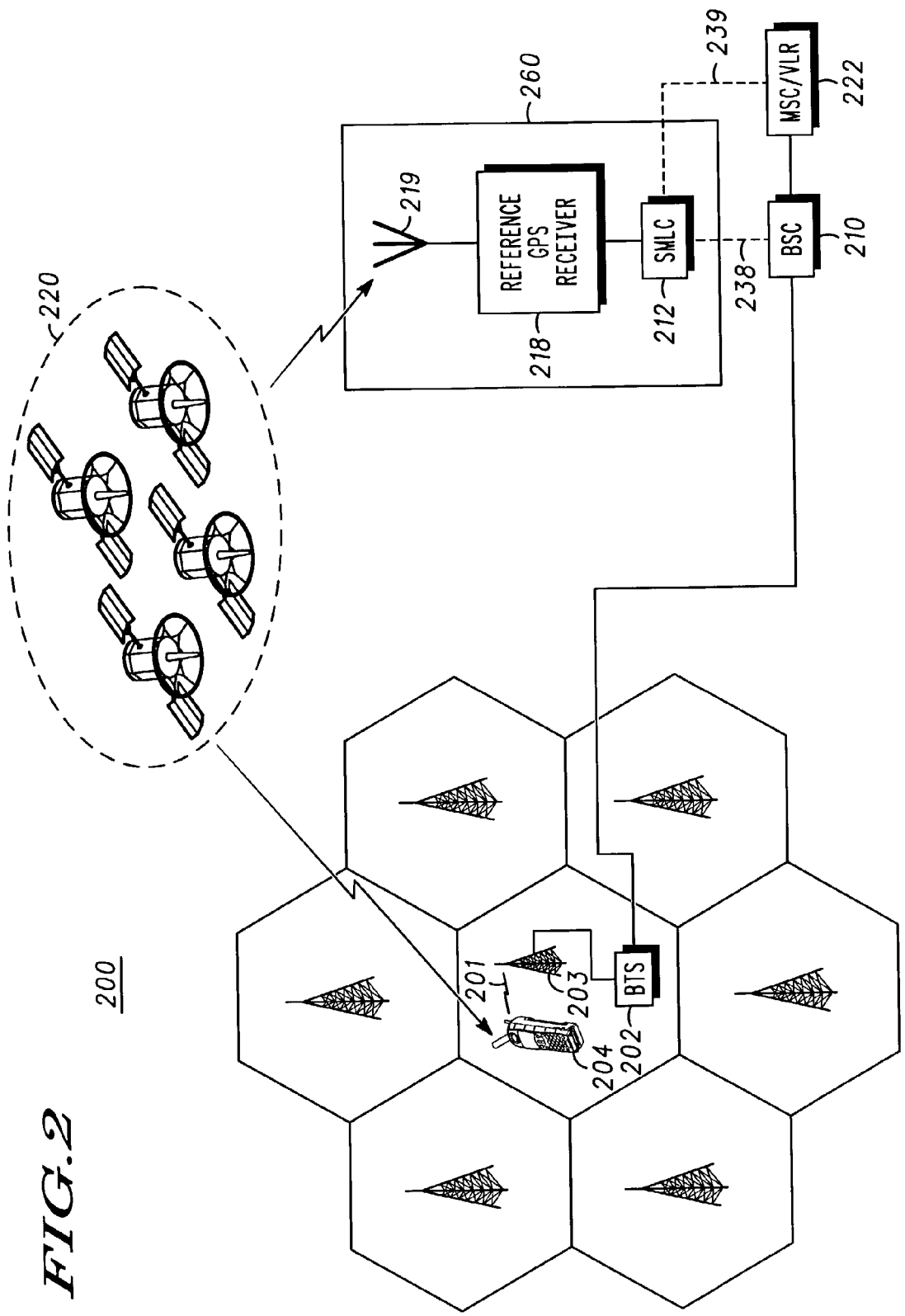
FIG. 2 is a system diagram of an assisted global positioning system (Assisted GPS) cellular radiotelephone system in accordance with the preferred embodiments.

FIG. 2 is a system diagram of an Assisted GPS cellular radiotelephone system 200 in accordance with a preferred embodiment. A reference GPS receiver 218 with is an antenna 219 is located at a surveyed location and has an open view of the sky in order to receive GPS satellite broadcast messages from GPS satellites 220. The reference GPS receiver 218 receives and tracks GPS satellite broadcast message signals from multiple GPS satellites 220 in order to generate GPS assistance data, which are selectively sent to certain mobile handsets 204 or broadcast to all mobile handsets, depending on the specific Assisted GPS mode in operation or requested by the location application. Assistance data can include reference location, reference time, GPS time, Doppler, code phase search window, ephemeris and clock corrections, ionospheric delay elements, Universal Time Coordinate (UTC) offsets, Almanac, DGPS corrections, and many other items. For systems using DGPS, the differential correction data that is generated by the reference GPS receiver 218 is preferably generated for all GPS satellites 220 within view of the reference GPS receiver antenna 219 to maximize the mobile handset coverage.

A serving mobile location center (SMLC) 212 in a GPS reference network node 260 collects the GPS satellite broadcast messages and prepares separate GPS assistance messages to be modulated by a base transceiver station (BTS) 202 on a cellular carrier signal 201 and sent to single or multiple handset 204. The specific message formats vary as a function of the transmission mode and assistance data type. Note that a single GPS reference network node 260 can be connected to more than one BTS. The BTS 202 with an antenna 203 transmits the GPS assistance messages at a much higher rate (such as 9600 BPS or higher) to the handset 204 equipped with a GPS sensor via the communications link 201. Communications link 201 can be any messaging method including use of modified cellular telephone control and communications messaging. The GPS sensor in the handset 204 then can get access to ephemeris, clock correction, and other assistance data sooner and can also obtain the data in environments in which the direct signal from the satellites 220 is blocked.

Links 238, 239 represent alternate architectures for an Assisted GPS cellular radiotelephone system 200. If link 238 is used (and therefore link 239 is not used), the GPS reference network node 260 links to a base station controller (BSC) 210. This architecture is known as base station subsystem (BSS)-based. If link 239 is used (and therefore link 238 is not used), the GPS reference network node 260 links to a mobile services switching center and visitor location register (MSC/VLR) 222 which is then linked to the BSC 210. This architecture is known as network system subsystem (NSS)-based. Typically, only one type of architecture is supported in a single network, but in both architectures, the BSC 210 is linked to a base transceiver station (BTS) 202 connected to an antenna 203.

The system architectures depicted in FIG. 2 are BSS-based and NSS-based architectures. While the preferred embodiments are described in terms of these architectures, these navigation message compression techniques can be enabled on many other system architectures. Both of these architectures imply that a GPS server (position determination entity) is an integral part of the GPS reference network node 260. A GPS server can be connected to the reference GPS receiver 218, be connected to the SMLC 212, be connected to the GPS reference network node 260, or be connected to another GPS reference network node.

As one skilled in the art would recognize, a reference GPS receiver and a related GPS server (position determination entity) could be located at any surveyed location with an open view of the sky, so long as it can be linked to the network or co-located with a network node. For instance, a server could be separated from the reference GPS receiver and integrated with a network node. At the request of a mobile station, a network, or a location service client, the assist data derived from the GPS reference network are transmitted via a communications network to the mobile GPS receiver to aid fast start-up, to increase the sensor sensitivity, and to reduce the power consumption needed to obtain position information.

Figure 1:
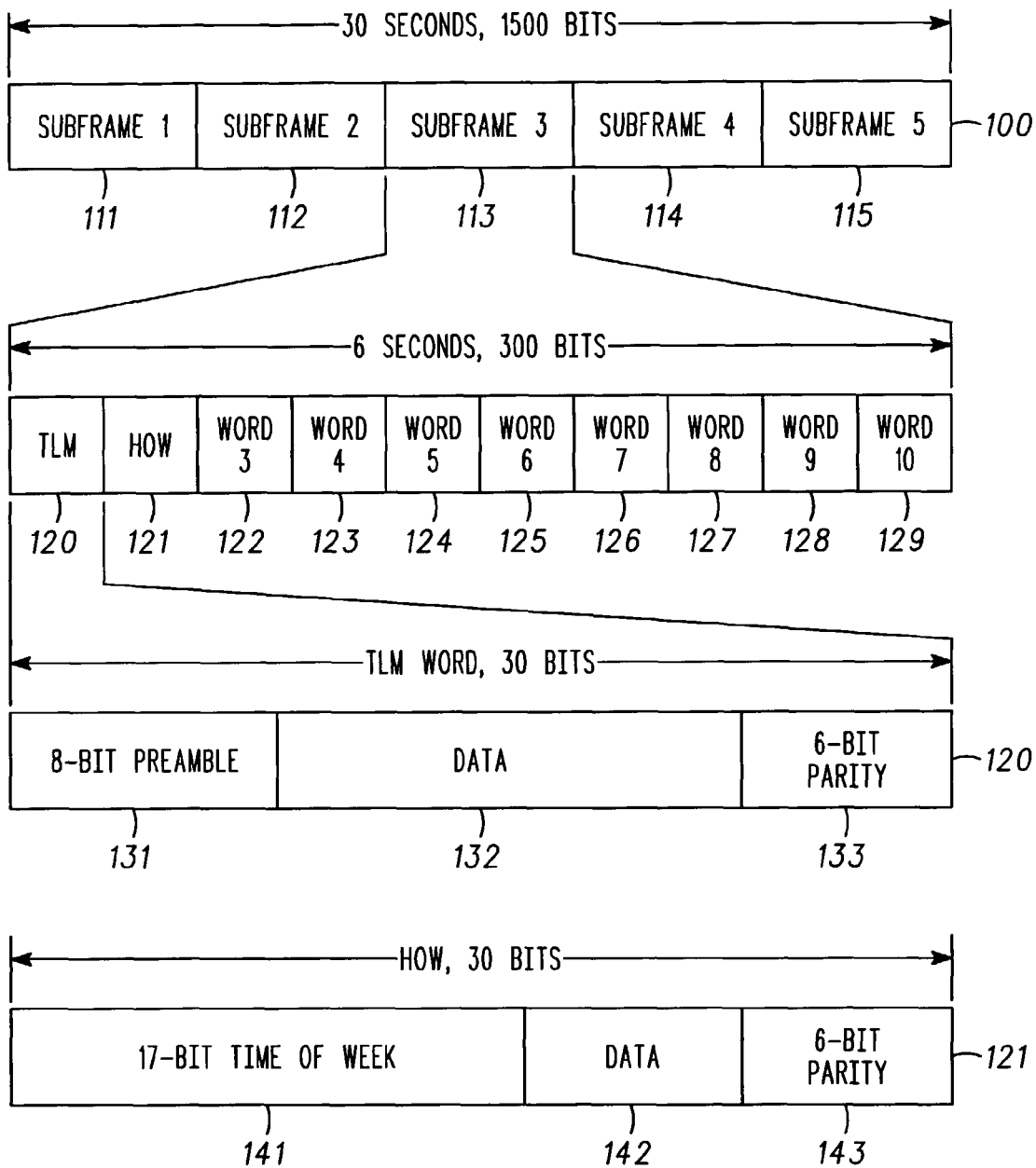
FIG. 1 details a prior art GPS satellite broadcast message.

A reference GPS receiver, such as reference GPS receiver 218 in FIG. 2, can obtain GPS time directly from the GPS satellite broadcast message 100 (see FIG. 1) through the use of the TOW 141 contained in the second word of every subframe 111, 112, 113, 114, 115. The TOW 141 describes the precise time of transmission of the leading edge of the first bit of the next subframe in GPS time-of-week coordinates. For example, the TOW in subframe 1 111 describes the GPS time-of-week of the leading edge of the first bit of the first word contained in subframe 2 112. Thus, once the GPS receiver observes the TOW, the time of week is known.

The first three subframes 111, 112, 113 of a GPS satellite broadcast message 100 contain the ephemeris and satellite clock correction data for the transmitting GPS satellite. The ephemeris data are precise orbit parameters that allow the GPS receiver the ability to recreate the flight path of the satellite. The data content of the first three subframes 111, 112, 113 has 720 bits of information per satellite (ignoring the six bits of parity that are sent for every twenty-four bits of information).

Returning to FIG. 2, one method of transmitting the information from a GPS reference network 260 to a handset 204 is to simply send all of the information content bits contained in the first three subframes 111, 112, 113 (without including parity information) to the handset 204 in a GPS assistance message. This raw information, however, can be compressed as described in the following embodiments.

In the first preferred embodiment, instead of the handset 204 receiving standard ephemeris and clock correction data elements directly from a satellite 260 or receiving standard ephemeris and clock correct data indirectly from the network, the handset 204 receives a satellite's position coordinates as computed form the ephemeris and clock correction data received by the network. Although the position coordinates are described here as X, Y, Z Cartesian coordinates, they may alternately be $\theta$, $\phi$, r spherical coordinates or other types of coordinates. The contents of this compressed GPS assistance message containing XYZ information are given in Table 1, where $t_2$ is $t_0+2\Delta t$ and $t_1. = t_0+\Delta t$. Note that the message has three sets of computed positions for each GPS satellite, which reduces the number of bits required to be broadcast relative to sending full sets of ephemeris data. These three sets of data are separated in time to permit mobile handsets to curve-fit interpolate between the times of applicability of the computed data to derive position and velocity data at the current time. The use of interpolation, rather than extrapolation, removes any significant error relative to handset computation based upon a full set of ephemeris data.

TABLE 1

Format of Compressed GPS Assistance Message Containing XYZ Information

| Parameter | Description |
|---|---|
| t0 | time of applicability of first set of positions |
| N_Sat | number of GPS satellites for which positions follow |
| SatID | ID for this set of positions |
| $X_0$ | ECEF X position component at time $t_0$, meters |
| $Y_0$ | ECEF Y position component at time $t_0$, meters |
| $Z_0$ | ECEF Z position component at time $t_0$, meters |
| $X_1$ | ECEF X position component at time $t_0+\Delta t$, meters |
| $Y_1$ | ECEF Y position component at time $t_0+\Delta t$, meters |
| $Z_1$ | ECEF Z position component at time $t_0+\Delta t$, meters |
| $X_2$ | ECEF X position component at time $t_0+2\Delta t$, meters |
| $Y_2$ | ECEF Y position component at time $t_0+2\Delta t$, meters |
| $Z_2$ | ECEF Z position component at time $t_0+2\Delta t$, meters |

Note that ECEF stands for earth-centered earth-fixed coordinates. In order to fit the above parameters or subset of these parameters into a variety of the message formats, they can be combined, separated, tailored, and compressed.

This compressed GPS assistance message containing XYZ information includes all three satellite position vectors in a single message containing $X_0, Y_0, Z_0; X_1, Y_1, Z_1;$ and $X_2, Y_2, Z_2$, each satellite position vector (X, Y, Z) separated by some agreed time interval, $\Delta t$. To further reduce the length of the GPS assistance messages, the message may be modified to include only one satellite position vector (X, Y, Z) per message, separated by some previously agreed time interval At. This would require the mobile station to obtain three successive broadcast messages at $t_1$, $t_2$, and $t_3$ before being able to compute the position of the mobile station at other times between $t_1$ and $t_2$ and between $t_2$ and $t_3$. This may be problematic, because it requires that the handset not miss a single transmission in order to obtain the full three measurements.

An algorithm is used by the handset to compute satellite position and velocity at an arbitrary time t, $t_0 < t < t_1$ (where $t_1 = t_0 + \Delta t$). The algorithm is iterative in nature, taking three steps: first computing an initial acceleration estimate from the position data, then computing a velocity estimate, and finally computing a position estimate. The algorithm is identical for each component of the position vector, so only a single component, X, is detailed in the equations below. First, an acceleration estimate is derived using Equation (1):

$$\ddot{X} = \frac{X_2 - 2X_1 + X_0}{\Delta t^2} \tag{1}$$

A velocity estimate is then derived using Equation (2):

$$\dot{X}_0 = \frac{X_1 - X_0}{\Delta t} - \frac{1}{2}\ddot{X}\Delta t \tag{2}$$

Finally, Equation (3) is used to interpolate for the GPS satellite position:

$$X(t) = X_0 + \dot{X}_0(t - t_0) + \frac{1}{2}\ddot{X}(t - t_0)^2 \tag{3}$$

Once the satellite positions are determined in the handset, and pseudo range measurements are made that represent the receiver-measured range between the receiver and the satellites (plus receiver clock bias), it is well known in the art as to how to compute the GPS receiver position from the measurements. See "Global Positioning System: Theory and Applications" by Bradford Parkinson, et al.

Figure 3:
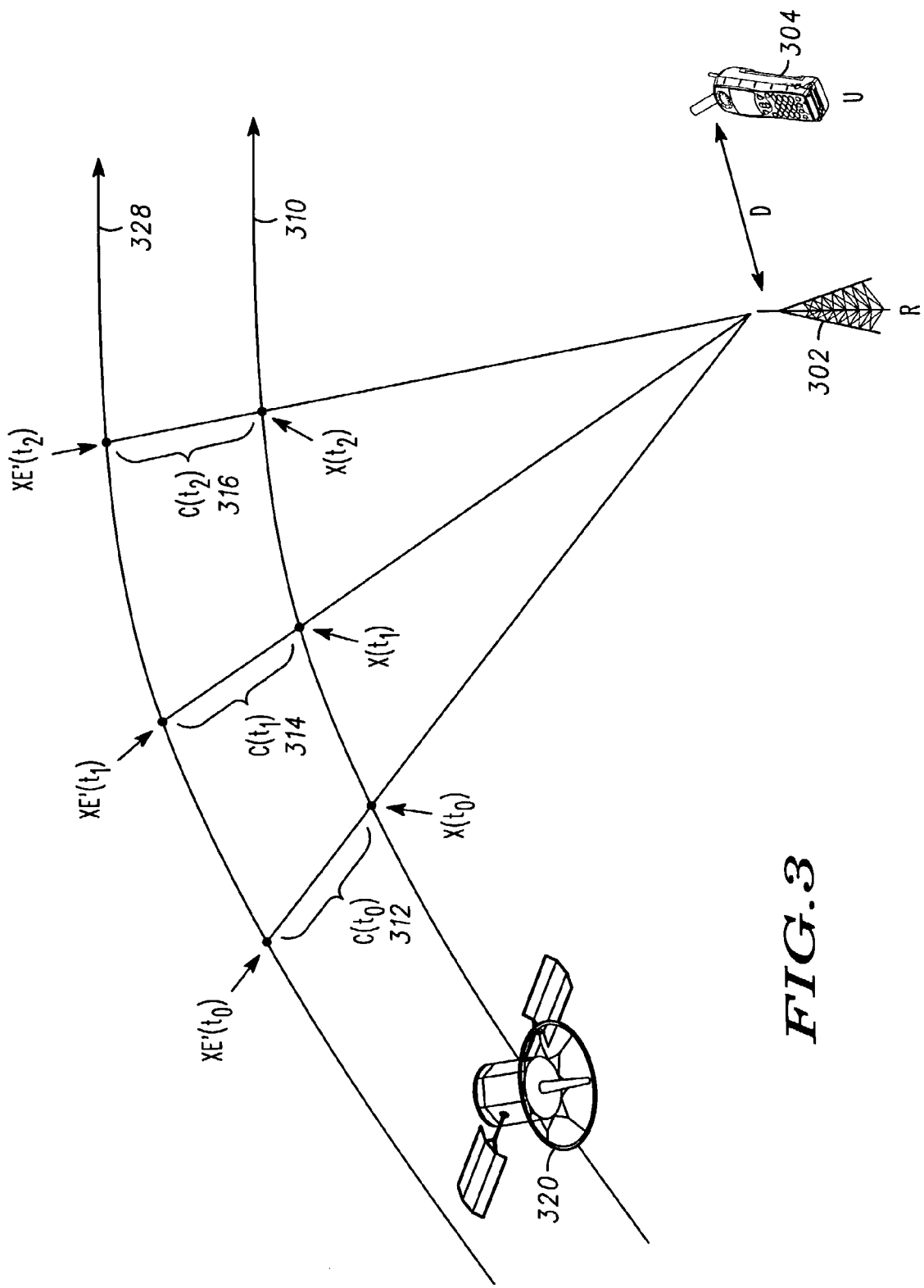
FIG. 3 illustrates the modification of true satellite position data in accordance with a first preferred embodiment.

Note that the satellite clock correction data is absent from the compressed GPS assistance message containing XYZ information. This is enabled by appropriately modifying the position data that is sent over the channel 201 (FIG. 2) to absorb the clock error effects as illustrated in FIG. 3. This permits elimination of the clock correction parameters completely and reduces even further the number of bits to be transmitted. In order to accomplish this, the effect of the clock error is translated into an equivalent satellite position offset as described below.

FIG. 3 illustrates the modification of the satellite position data in accordance with the first preferred embodiment. In FIG. 3, a GPS satellite 320 orbits above a radio communication system. The radio communication system includes a plurality of base stations 302 (or other network nodes) in two-way wireless communication with mobile stations such as mobile handset 304. The handset 304 receives the compressed GPS assistance message containing XYZ information in the format detailed in Table 1 above. Translating the effect of clock error into equivalent satellite position offset requires that the satellite orbit curve fit of the true position of the satellite X(t), represented by the curve 310, be modified by an amount corresponding to the satellite clock correction to create an effective position curve XE'(t), represented by the curve 328. Effective range extensions $C(t_0)$ 312, $C(t_1)$ 314, and $C(t_2)$ 316 are computed from the satellite clock correction as derived from the ephemeris data at time $t_0$, $t_1$, and $t_2$ multiplied by the speed of light (SOL). This magnitude can be either positive (farther from a reference point R) or negative (closer to the reference point R).

The effective position XE'(t), represented by the curve 328, is calculated as follows:

$$XE'(t_0) = X(t_0) + C(t_0)SOL\left(\frac{X(t_0) - R}{|X(t_0) - R|}\right) \tag{9}$$

In order to create the effective satellite orbit, the reference point R is required to project the satellite orbit position along the line extending between its true position X(t) and the reference point R. The reference point R can conveniently be the base station 302 or another node that is connected with a reference GPS receiver (not shown). Thus, simple vector mathematics modifies the satellite orbit path X(t) 310 to the effective orbit path XE'(t) 328. orbit path XE'(t) 328.

Choosing each individual base station of the system as the reference point R allows for control of the error induced in the range measurement. Compared with the distance from the location U of the mobile station 302 to the location of the satellite 320, the separation distance D between the base station 302 and the mobile station 304 is very short. Let us assume that the base station 302 is within 10 km of the mobile station 304 (valid most of the time in cellular systems). Also, it is known that the satellite clock correction cannot be any larger than 5 ms, since this is the maximum magnitude of the parameter. The maximum error in satellite predicted range is a function of this clock error and the separation distance D. Then, the calculated maximum error in the measured range based on the modified or projected satellite orbit, a 10 km separation distance D, and 5 ms of clock correction is approximately 1 meter, which is acceptably small given other system errors such as multipath, receiver noise, ionospheric delay, and other quantization effects.

One can further compress or reduce the amount of data necessary to transmit the satellite broadcast ephemeris data through multiple techniques. For example, one can form a second (or higher)-order curve fit to the satellite motion equations, and transmit the curve fit parameters themselves instead of the larger ephemeris data. This technique is effective in reducing the total number of bits necessary to be communicated from the infrastructure to the mobile by about a factor of two. Alternately, as mentioned previously, three sets of satellite X, Y, and Z coordinates can be transmitted to the mobile at three known times $t_0$, $t_1$, and $t_2$, and the mobile can compute the curve fit parameters in the mobile, thus allowing the mobile to compute the position of the satellite at any time between $t_0$ and $t_2$.

All of these techniques are useful in transmitting compressed raw information from the GPS satellites to the mobile for GPS satellite orbit determination; however, they miss transmitting one other key information element contained in the GPS satellite 50 BPS message sequence, that being time.

As mentioned earlier, the GPS satellite 50 BPS message is synchronized to GPS time very precisely. The GPS receiver measures the time of arrival of the message, and the message contains information (primarily the TOW 141, contained in the second word of every subframe 111, 112, 113, 114, 115) indicates the precise time of arrival of the beginning of the first bit of the next subframe. In some cellular systems (e.g., CDMA), time is known precisely in the handset. In others (e.g., AMPS, GSM, TDMA, W-CDMA, UMTS, etc.), time is not known and various complicated and expensive techniques are used to transmit time to the mobile stations.

One technique of time transfer that can be employed is to transmit all the GPS satellite transmitted data bits to the mobile station, time tagged appropriately so that the precise GPS time of any single bit allows the handset to compute the time of any or all of the bits. The handset then correlates across multiple data bits the known data bit pattern against the received signal. Finding the maximum correlation point identifies the time that the particular message bit sequence is received. The time offset of the correlation maximum is then a time offset in the handset clock, and the handset clock can be corrected.

Figure 4B:
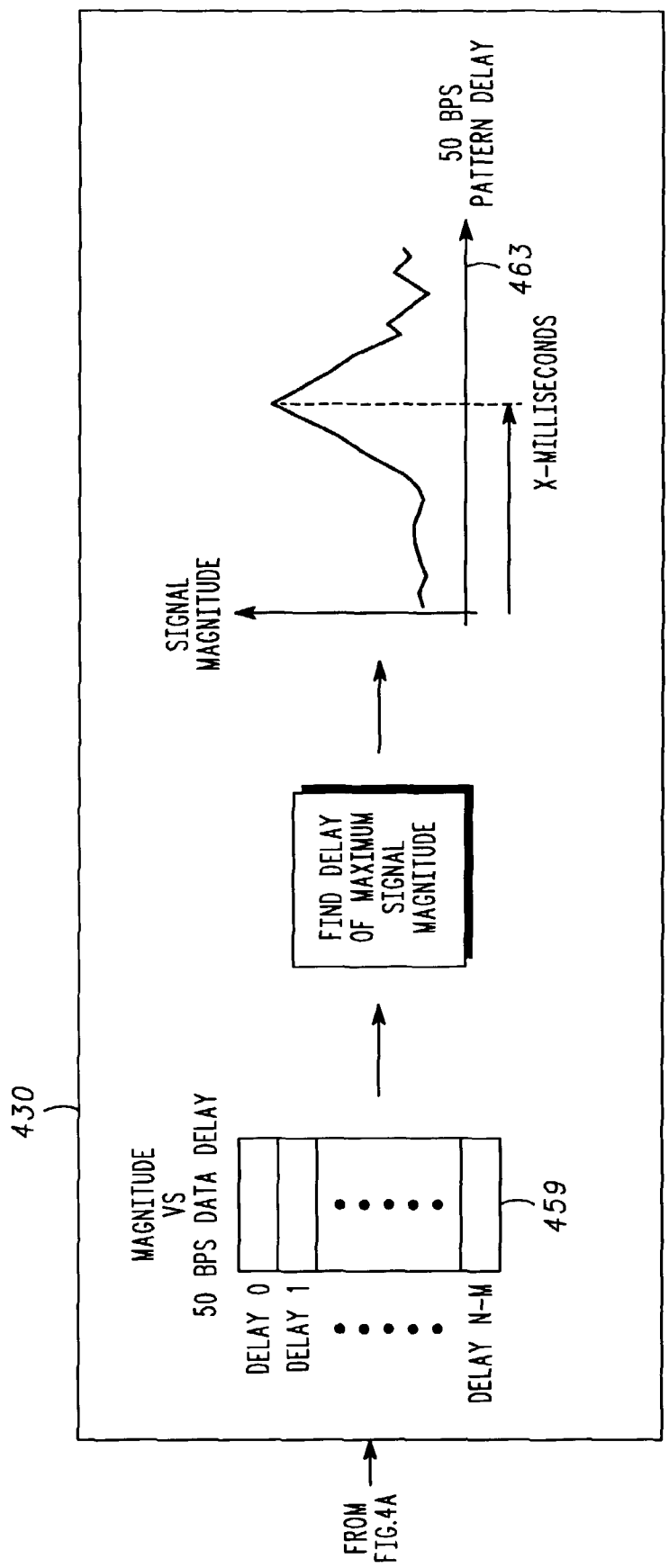

The process of time determination using decompressed information from a GPS assistance message is explained in FIG. 4A and FIG. 4B showing three main steps. In step 410, the despread I and Q samples output at 1 millisecond rates from a correlator 441 in the handset 204 (shown in FIG. 2) are stored into a local memory 445, for the period of expected correlation with a known PRN code data bit sequence transmitted from the BTS 202 (shown in FIG. 2). In step 420, the handset 204 accepts a GPS assistance message 451 from the BTS 202 for the period of time expected to be stored in memory 445. The handset 204 then reconstructs the GPS satellite broadcast message by replacing data not transmitted with computed or predicted fields and stores it in local memory 453. Expander 455 expands the GPS satellite broadcast message data, for each bit, expanded to twenty bits of the same polarity. Set delay 456 to zero delay. Correlate all memory 445 words against the GPS satellite broadcast message data pattern in memory 453, summing for the length of memory storage 445 in summation block 457 the expanded GPS satellite broadcast message data pattern with each of the N words stored in memory 445. Compute the magnitude of this sum in magnitude computation block 458, store the result into memory zero of magnitude vs. delay memory 459. Set delay block 457 to one millisecond delay, repeat again, summing into magnitude vs. delay memory 459, address one. Repeat until all possible delays of block 457 are completed, summing into all applicable delays in the magnitude vs. delay memory 459.

In step 430, scan the magnitude vs. delay memory 459 for the maximum magnitude. The memory storage address corresponding to the maximum magnitude correlation sum corresponds to the time delay between the start of capture of the data into local memory 445 and the time corresponding to the time of the first bit of the GPS satellite's broadcast message stored into memory 445.

Those skilled in the art will recognize that this time delay can then be used to know the time offset of the expected time of arrival of the GPS satellite broadcast message sequence and its actual TOA. The time error can then be used to correct the local (handset) time clock. It is also possible for an infrastructure-to-mobile transmitted message to be sent that indicates approximate time to the mobile (e.g. a time clock in the infrastructure enables a message at a particular time), so that the mobile knows approximately what time to look for the known GPS satellite broadcast message pattern.

The time uncertainty is known to be a function of the signal propagation delay and latencies associated with sending a message from the infrastructure to the mobile. It is expected that this latency is no more than a few seconds worse case, which limits the range over which the mobile must look for the data pattern.

In this way, knowledge of the GPS time corresponding to any single bit allows time knowledge of any bit (each bit is different in time by twenty milliseconds). The problem is now in communicating the large amount of raw 50 BPS data in a bit-efficient manner to mobile stations.

A second preferred embodiment proposes an infrastructure broadcast or point-to-point message that delivers the 50 BPS message contents of the GPS satellite-transmitted message in a bit-efficient manner. The second preferred embodiment transmits only the data that is not redundant or not predictable. In this manner, the number of data bits in a GPS assistance message can be reduced. Looking at FIG. 1, there are data bit fields in the subframes that are the same for every subframe. For example, the first eight bits of the first word 120 of every subframe 111, 112, 113, 114, 115 contains a preamble 131, Because the preamble 131 is the same and known for every subframe, it need not be transmitted. Similarly, the TOW 141 is a seventeen-bit long sequence that is predictable with time. As long as time is known to within three seconds, the GPS receiver can predict the TOW data pattern contained in the current subframe. Also, one can predict the TOW 141 at the start of the first subframe 111, thus a fifteen-second window of time uncertainty is allowed. Also, the three-bit subframe identification parameter contained in the third word 122 of every subframe 111, 112, 113, 114, 115 is also predictable with time. In a similar way, the thirty-bit long telemetry (TLM) word 120 contained in the first word of every subframe 111, 112, 113, 114, 115, needs only be sent once, because most of the time, the TLM word 120 is the same for every subframe (i.e., the TLM word changes much more slowly than once every six seconds). Consequently, if the TLM word 120 is sent from the first subframe 111, it is highly likely that the same TLM word will be sent again in the second and third subframes 112, 113. In this way, the GPS satellite message 100contents can be reduced.

As mentioned earlier, each thirty-bit word 120, 121, 122, 123, 124, 125, 126, 127, 128, 129 contains a six-bit parity and a twenty-four-bit information field. The parity bit field need not be transmitted to the mobiles, because the mobiles can recompute the is data pattern based on the twenty-four bits of the current word and the last two computed parity bits from the preceding word. Finally, the original satellite transmitted data contains an IODE (issue of data ephemeris) parameter that is duplicated in the first three subframes 111, 112, 113. The IODE parameter is intended to ensure that a GPS receiver collecting ephemeris data from separate subframes collects all three subframes with the same IODE, thus ensuring that the ephemeris and clock data are for the same issue. In a scheme that transmits the ephemeris and clock correction in a single message, there is need for transmitting only one IODE parameter; the IODEs from the second and third subframe 112, 113 can be eliminated. Thus, a GPS assistance message that contains all of the non-redundant and non-predictable bits in the first three subframes 111, 112, 113 can be built as follows:

From subframe 1 111: transmit all data bits, minus parity bits, minus message preamble, minus subframe identification;

From subframe 2 112: transmit all data bits, minus parity bits, minus message preamble, minus TOW 141, minus subframe identification, minus TLM word 121, minus IODE; and From subframe 3 113: transmit all data bits, minus parity bits, minus message preamble, minus TOW 141, minus subframe identification, minus TLM word 120, minus IODE.

The format of a compressed GPS assistance message containing subframe 1, 2, 3 data is shown in Table 2.

TABLE 2

Format of Compressed GPS Assistance Message Containing Subframe 1, 2, 3 Data.

| Parameter | Description |
|---|---|
| dT1 | The time difference between the time of transmission of this compressed GPS assistance message and the time indicated by the first bit of subframe 1 message bits. (See FIG. 5) |
| SVID | Satellite ID for the Data contained in this message |
| Subframe 1 Data | All of subframe 1 data, excluding parity bits, preamble, and subframe ID |
| Subframe 2 Data | All of subframe 2 data, excluding parity bits, TLM word, preamble, TOW, subframe ID, and IODE |
| Subframe 3 Data | All of subframe 3 data, excluding parity bits, TLM word, preamble, TOW, subframe ID, and IODE |

A minor modification to the above table could eliminate the TOW 141 from the subframe 1 data. But for the added convenience of giving the handset the actual time of subframe 3, it is recommended that the first TOW word be left in subframe 1 data.

Figure 5:
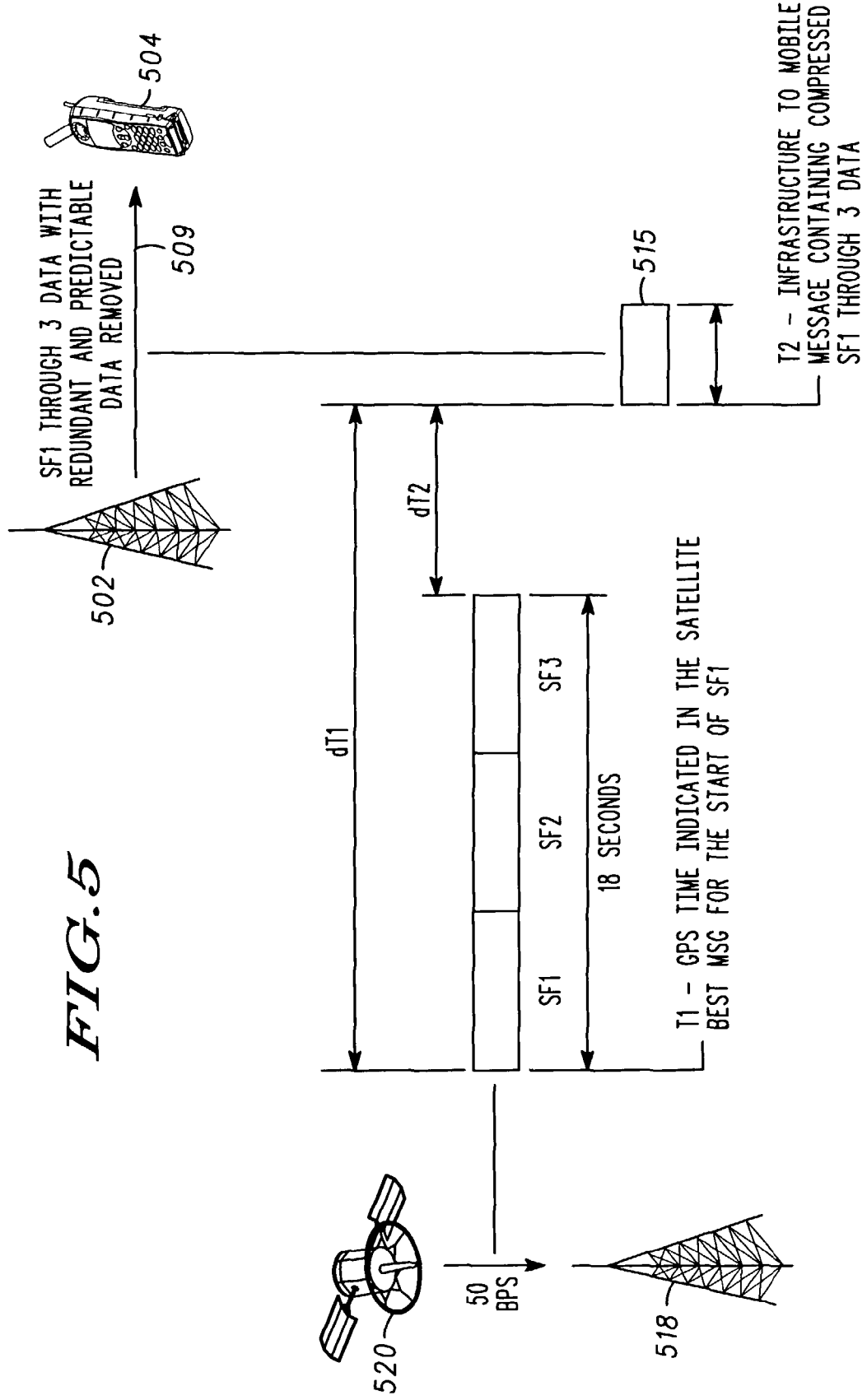
FIG. 5 illustrates timing considerations when transmitting a GPS assistance message in accordance with a second preferred embodiment.

As shown in FIG. 5 the transmitted message for subframes 1 through 3 of a GPS satellite 520 consists of three subframes of 50 BPS data, having a total length of 900 bits. An reference GPS receiver 518 connected to a base transceiver station (BTS) 502 via other network nodes collects the 50 BPS data sequence and stores it in a local memory (not shown). The data is assembled and compressed as described previously into a compressed GPS assistance message containing subframe 1, 2, 3 data 515. At some pre-determined broadcast message time T2 (e.g., once every ninety seconds or some other periodic rate), the compressed message 515 having the non-predicted and non-redundant bits transmitted by the GPS satellite 520 is broadcast from the infrastructure to a mobile station 504 using a formatted message 509. The formatted message 509 is time-tagged with a representation of time dT1, good to at least three-seconds accuracy. Mobile station 504 can now know the delay time dT1 between T2 and T1 or the delay time dT2 between T2 and the end of the three subframes, because it knows the TOW contained in the first subframe of data. Accuracy of this time delay is to the level of a few seconds.

Using the correlation technique described earlier with reference to FIG. 4, the actual precise delay can be computed, and then precise knowledge of time will then be available and known by the handset 504. As long as it takes less than fifteen seconds to transmit the compressed GPS assistance message containing subframe 1, 2, 3 data to the mobile station 504 (allowing for message delivery latencies), the mobile station 504 can then recreate the entire 900-bit sequence contained in the first three subframes of a GPS satellite broadcast message for purposes of extracting the message contents and for having the 900-bit long data pattern available for time determination within the mobile station 504.

In a similar manner, a compressed GPS assistance message having the contents of subframes 4, 5 data can be created. Again, redundant and predictable message bits from the GPS satellite broadcast message 100 (FIG. 1) are eliminated when being transmitted from the infrastructure to the mobile stations. Such a message is shown in Table 3.

TABLE 3

Format of Compressed GPS Assistance Message Containing Subframe 4, 5 Data.

| Parameter | Description |
|---|---|
| dT1 | The time difference between the time of transmission of this compressed GPS assistance message and the time indicated by the first bit of subframe 1 message bits. (See FIG. 5) |
| SVID | Satellite ID for the Satellite that Transmitted this Data |
| Subframe 4 Data | All of subframe 4 data, but excluding parity bits, preamble, and subframe ID |
| Subframe 5 Data | All of subframe 5 data, excluding parity bits, preamble, TOW, TLM word, and subframe ID. |

Two separate types of compressed GPS assistance messages have been created. One message, containing subframe 1, 2, and 3 data for a particular satellite, and another message containing subframe 4 and 5 data from a particular satellite. The distinction and separation of the two messages is important as it now allows the two separate messages to be broadcast at two separate rates, the rates coinciding with a first optimum rate to deliver satellite ephemeris and clock correction data, and another optimum rate to deliver other constellation data from subframes 4 and 5.

For example, given a condition where there are eight visible satellites, a compressed GPS assistance message containing subframe 1, 2, 3 data as shown in Table 2 can be broadcast at, for example, ninety second intervals, which transmits the entire satellite ephemeris and clock correction data from one satellite every ninety seconds. In such a scheme, the ephemeris and clock correction data for the eight visible satellites is transmitted once every twelve minutes. As a broadcast message, this is reasonable period of time to ensure that new mobiles at power-on are delivered all the required ephemeris and clock correction data for all visible satellites in a short period of time. Since mobile phones are now generally powered on once in the morning and are left on all day long, the broadcast rate allows all mobile stations to be kept up to date at all times. This is because the validity period of ephemeris and clock data is approximately four hours, but it is possible for new satellites to rise and set, making it important that new data be delivered to newly visible satellites in short period of time.

As for subframe 4, 5 data, mostly consisting of satellite almanac data for all satellites in the constellation, and including UTC to GPS time offset, ionospheric delay, and other very slowly changing parameters, it is possible to broadcast one compressed GPS assistance message containing subframe 4, 5 data at a much slower rate that is appropriate with updating the information in the handset periodically. For example, the almanac data typically changes every two days, but it is valid for months. Consequently, transmitting subframe 4, 5 data at a rate that causes the information to be updated in the mobile station at, say, once every few hours or once per day allows for more rapid update of ephemeris data in order to keep it updated, at the expense of updating the almanac and other subframe 4, 5 data at a much slower rate. This type of dynamic allocation of the wireless transmission resource can be accomplished in real time by a service operator based on the present usage pattern and traffic load. For example, a service operator can dynamically adjusting the GPS assistance message update rates during periods of heavy traffic load, favor subframe 1, 2, 3 data over subframe 4, 5 data during high traffic times, and/or resume standard update rates during periods of light traffic.

Actually, all the GPS assistance messages can been organized together under one control header. This control header can have ciphering information, data format (content) information, and other common parameters shared by these messages. After decoding this control header, the handset would know what kind of data is contained in the rest of the message. For example, a control header can contain the two messages discussed in Table 2 and Table 3, plus Acquisition Assist and DGPS correction messages. To allow further expansion, the data format parameter can be reserved in a way such that more than merely these four types of messages can be controlled by the control header. Like the subframe 1, 2, 3 data and subframe 4, 5 data messages, the transmission rates of the other messages could be different or could be adjusted dynamically. For instance, the Acquisition Assist message could be broadcast once every nine minutes and the DGPS Correction message could be broadcast once every thirty seconds. Alternatively, they can be adjusted based on the network load and other factors as previously discussed.

For the Acquisition Assist message, besides time of applicability, SVID, Doppler ($0^{th}$, $1^{st}$, and $2^{nd}$ order), Code Phase and Integer Code Phase, Reference Location (latitude, longitude, and height) can be included to allow the handset to know where this message is generated. Typically, the GPS assistance message transmission coverage area is larger than a single cell. By knowing this additional information, the handset can utilize the rest of the assistance data parameters accordingly.

The DGPS Correction message can contain timing information, health status, how many satellite corrections are included, and other DGPS correction parameters, such as satellite ID, IODE, user differential range error (UDRE), pseudo range correction (PRC) and pseudo range-rate correction (RRC). In addition, correction differences (delta PRC and delta RRC values) can be included for multiple copies of ephemeris and clock correction data used by different handsets in the broadcast area. Depending on the available message length, this could be as short as one set of the differences, or as long as four sets of the differences.

The GPS assistance messages discussed can be used in both broadcast and point-to-point transmission modes. In order to fit these messages into different formats, one skilled in the art would realize that the parameters discussed for each message can be combined, separated, tailored, and compressed to form different lengths for transmission.

While the foregoing described embodiments have been set forth above, it will be appreciated to one skilled in the art that the inventions described have applications beyond the described embodiments. Accordingly, it is intended that the scope of the invention including such alternatives, modifications, and variations contemplated shall be defined by the appended claims.

What is claimed is:

1. A method for transmitting global positioning system (GPS) assistance information from communications infrastructure to a wireless communications handset, comprising:
    transmitting, from the communications infrastructure, compressed GPS subframe 1, 2, 3 data in a GPS assistance message; and
    transmitting, from the communications infrastructure, compressed GPS subframe 4, 5 data in a separate GPS assistance message.

2. A method for transmitting satellite positioning system assistance messages from communications infrastructure to a mobile wireless communications handset, the method comprising:
    transmitting, from the communications infrastructure, a satellite positioning system assistance message containing first compressed subframe data at a first transmission rate; and
    transmitting, from the communications infrastructure, a compressed satellite positioning system assistance message containing second compressed subframe data.

3. A method according to claim 2, transmitting the compressed satellite positioning system assistance message containing second compressed subframe data at a second transmission rate.

4. The method according to claim 2, further comprising transmitting estimated handset position and satellite positioning system reference time at one of the first transmission rate and at a third transmission rate.

5. A method according to claim 2, transmitting a differential satellite positioning system (DSPS) correction message at a fourth transmission rate, wherein transmitting the DSPS correction message at a fourth transmission rate comprises dynamically adjusting the fourth transmission rate.

6. A method for transmitting satellite positioning system assistance messages from communications infrastructure to a wireless communications handset, the method comprising:
    transmitting, from the communications infrastructure, a first satellite positioning system message at a first transmission rate,
    the first satellite positioning system message including at least one of location, time, DGPS, ephemeris, almanac, ionispheric, and time offset information;
    transmitting, from the communications infrastructure, a second satellite positioning system message at a second transmission rate different than the first transmission rate of the first message,
    the second satellite positioning system message including at least one of location, time, DGPS, ephemeris, almanac, ionispheric, and time offset information.

* * * * *